(12) United States Patent
Martin-Lopez

(10) Patent No.: US 8,509,579 B2
(45) Date of Patent: Aug. 13, 2013

(54) SOLAR ENERGY COLLECTOR

(76) Inventor: Fernando Ramon Martin-Lopez, Colorado Springs, CO (US)

( * ) Notice: Subject to any disclaimer, the term of this patent is extended or adjusted under 35 U.S.C. 154(b) by 0 days.

(21) Appl. No.: 13/506,119

(22) Filed: Mar. 28, 2012

(65) Prior Publication Data

US 2012/0260910 A1    Oct. 18, 2012

Related U.S. Application Data

(62) Division of application No. 12/381,696, filed on Mar. 16, 2009, now Pat. No. 8,165,435.

(51) Int. Cl.
    *G02B 6/32*      (2006.01)
    *G02B 6/26*      (2006.01)
    *G02B 6/42*      (2006.01)

(52) U.S. Cl.
USPC .................. 385/33; 385/31; 385/39; 385/47; 385/900

(58) Field of Classification Search
USPC .............................................. 385/33, 47, 900
See application file for complete search history.

(56) References Cited

FOREIGN PATENT DOCUMENTS

| | | | |
|---|---|---|---|
| GB | 2 218 798 A | | 11/1989 |
| JP | 04-111475 | * | 4/1992 |
| WO | WO 97/33128 A1 | | 9/1997 |

* cited by examiner

*Primary Examiner* — Ryan Lepisto
(74) *Attorney, Agent, or Firm* — William E. Hein

(57) ABSTRACT

A multiplicity of Fresnel lenses are attached to tubular branches of a tree-like support structure. Fiber optic bundles are connected to the Fresnel lenses and routed inside the tubular branches and collected as a larger fiber optic bundle inside a main trunk structure to which each of the branches is connected. The larger fiber optic bundle may be connected to a remotely located power generating plant or other processing facility via a fiber optic transmission network. A domed solar energy collector includes an outer dome and one or more inner domes concentrically nested therewith, one or more Fresnel lenses being positioned on the hemispherical surface of each of the outer and inner domes to thereby multiply the solar energy focused through each of the domes to a collection area within the innermost dome.

2 Claims, 8 Drawing Sheets

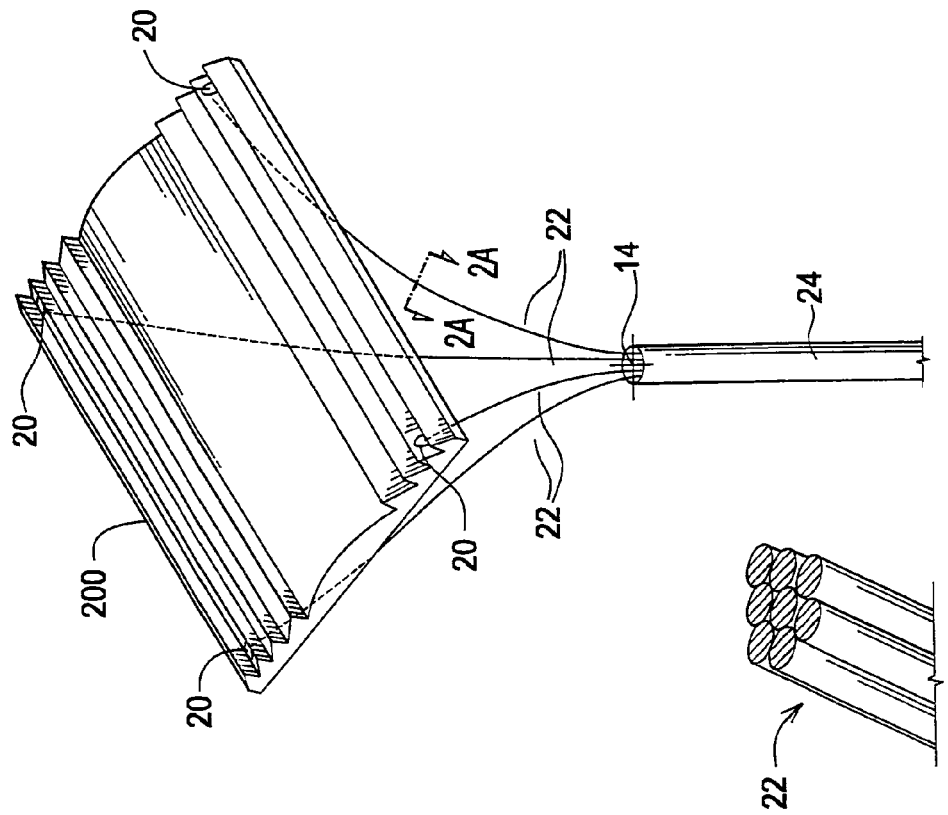
FIG. 2
FIG. 2A
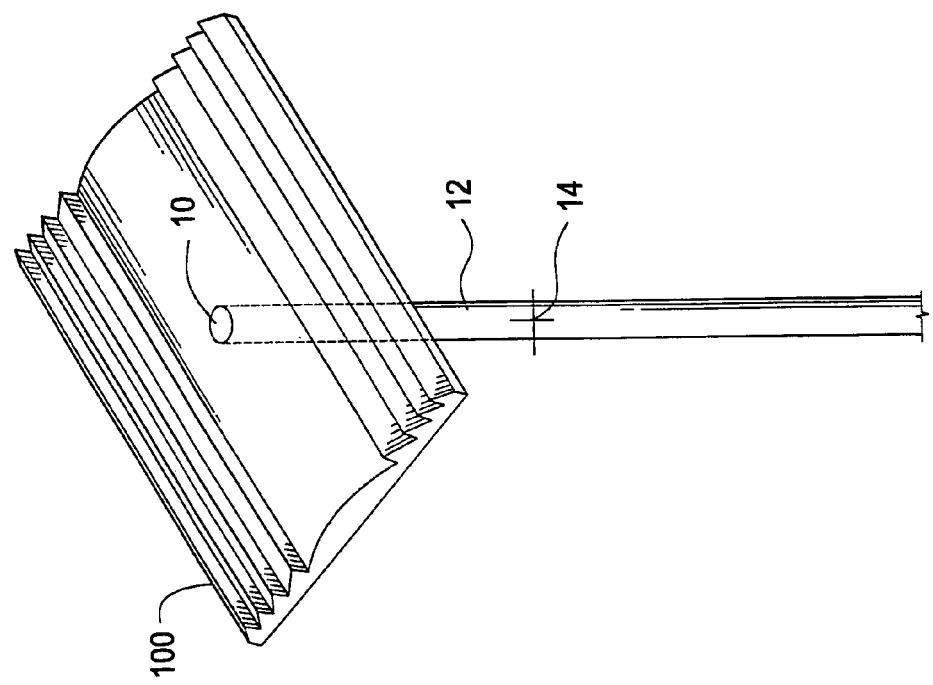
FIG. 1

US 8,509,579 B2

SOLAR ENERGY COLLECTOR

REFERENCE TO RELATED APPLICATION

This application is a division of, incorporates the subject matter of, and claims the benefit of U.S. patent application Ser. No. 12/381,696 filed Mar. 16, 2009, issued on Apr. 24, 2012, as U.S. Pat. No. 8,165,435.

BACKGROUND AND SUMMARY OF THE INVENTION

This invention relates generally to solar energy and, more particularly, to the collection of solar energy through the use of Fresnel lenses in various configurations.

Numerous devices for harnessing the sun's energy are well known in the prior art. U.S. Pat. No. 4,723,826 is directed to a conventional fiber optic solar energy collector employing a matrix of lenses mounted in a fixed position. One or two plates placed in the focal plane of the lenses are moved to track the sun's position during the daylight hours. U.S. Pat. No. 7,295,372 is directed to an apparatus for collecting and transmitting sunlight into a space. U.S. Patent Application Publication No. US 2006/0165358 is directed to a fiber optic connection system including compact bundles of light guides with sections having a reduced interstitial area. U.S. Patent Application Publication No. 2007/0137640 is directed to a solar energy collecting system that tracks the sun and maintains a constant focal point for condensing the sun's rays into a high-energy beam that is then redirected to a predetermined location for use in well-known applications such as electrical power, heat, or steam generation. U.S. Pat. No. 4,201,197 is directed to a solar energy collector employing fiber optic cables and a mechanical sun tracking and orienting positioner. These prior art solar energy collection systems are disadvantageous in that they involve complex mechanical arrangements for tracking the sun's position.

In accordance with one aspect of the present invention, a multiplicity of Fresnel lenses are attached to tubular branches of a tree-like support structure. Fiber optic bundles are connected to the Fresnel lenses and routed inside the tubular branches and are collected as a larger fiber optic bundle inside a main trunk structure to which each of the branches is connected. The larger fiber optic bundle may be coupled directly or by means of a fiber optic transmission network to an external energy receiving device for further processing of the collected solar energy.

In accordance with another aspect of the present invention, a skeletal hemispherical dome solar energy collector structure includes a plurality of main beams in the form of inverted semicircular hoops of differing graduated diameter positioned parallel to each other. A plurality of transverse beams are connected in spaced apart, staggered positions between adjacent ones of the main beams to provide support therefore. The space between each adjacent pair of the transverse beams and the adjacent pair of the main beams to which they are connected serves to retain a Fresnel lens inserted therein. Alternatively, a single Fresnel lens may occupy the area between adjacent main beams, or a single larger Fresnel lens may form the hemispherical surface of the collector structure.

In accordance with another aspect of the present invention, the hemispherical dome structure of the preceding paragraph is repeated as domes of decreasing diameter to form a nested hemispherical dome solar collector structure that includes an outer dome and one or more inner domes nested concentrically thereunder, the innermost dome serving as a collection dome. Each of the inner domes is sized and positioned such that its surface lies on the focal point of the next larger dome. This arrangement results in the multiplication of solar energy focused through each of the domes to a collection area within the innermost dome containing a fiber optic collection network.

BRIEF DESCRIPTION OF THE DRAWINGS

FIG. 1 is a pictorial diagram illustrating the use of a typical Fresnel lens connected to a single fiber optic bundle for collecting solar energy, in accordance with one aspect of the present invention.

FIG. 2 is a pictorial diagram illustrating multiple points on a Fresnel lens at which fiber optic bundles are connected for collecting solar energy.

FIG. 2A is an illustration of eight individual fibers that constitute one of the 8-fiber bundles of the 32-fiber bundle connected to the Fresnel lens of FIG. 2.

DETAILED DESCRIPTION OF THE INVENTION

Figure 3:
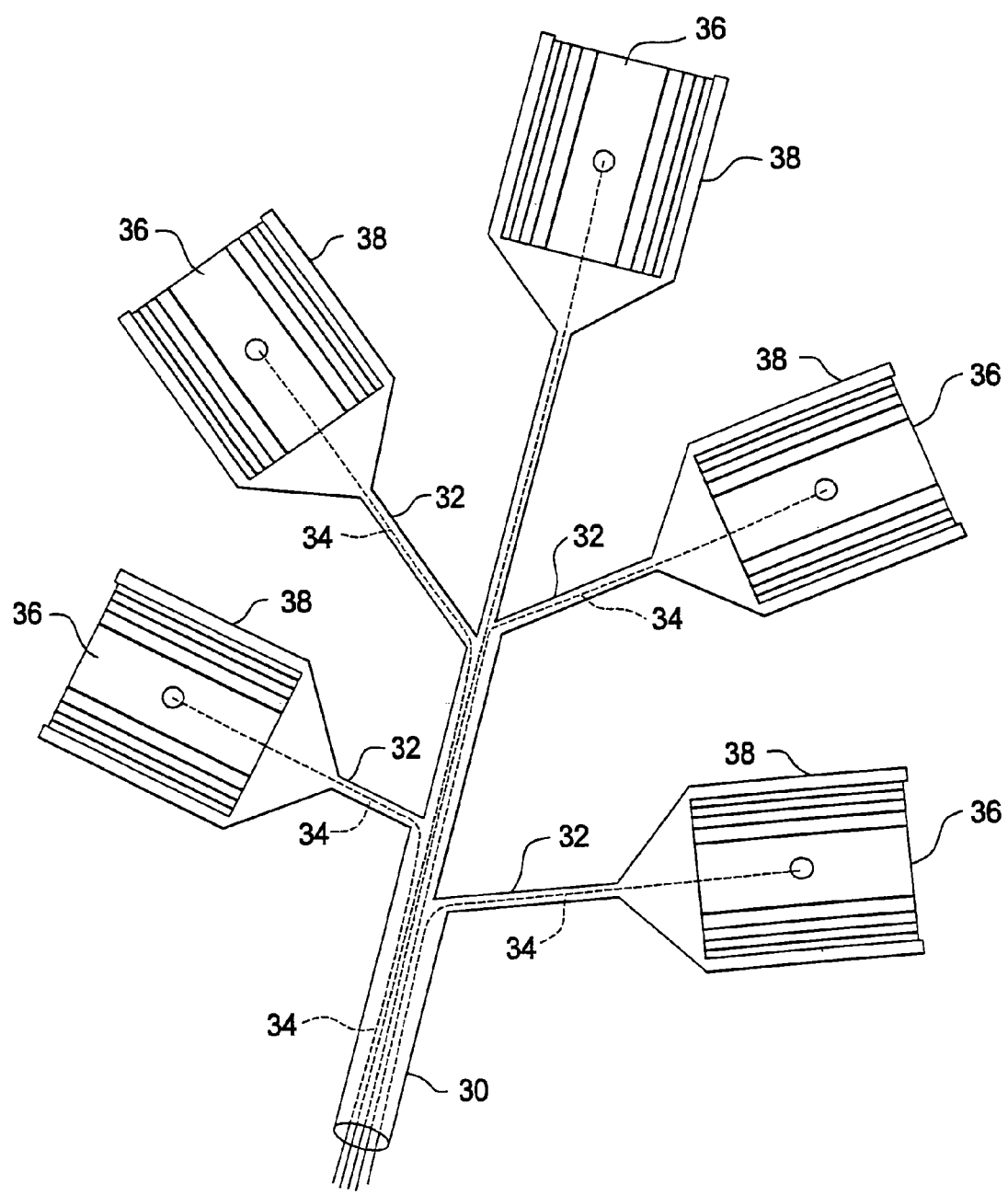
FIG. 3 is a pictorial diagram illustrating a tree branch structure for supporting multiple Fresnel lenses to which fiber optic bundles are connected, as shown in FIGS. 1 and 2, for collecting solar energy.

Referring now to FIG. 1, there is shown a Fresnel lens 100 having a central circular opening 10 therein. Fresnel lens 100 may comprise, for example, an inexpensive Fresnel lens having a focal length of approximately one inch and commercially available from such companies as 3Dlens.com. These lenses are approximately 52 mm by 82 mm (2 inches by 3.2 inches) in length and width and are approximately 0.016 inches in thickness. Circular opening 10 may be simply drilled in Fresnel lens 100 to accommodate a fiber optic cable 12 that is inserted through Fresnel lens 100 from the underside thereof Fiber optic cable 12 may be held in place by means of any of a number of commercially-available fasteners, not illustrated, such as o-rings or cable ties, for example, secured over fiber optic cable 12 on either side of Fresnel lens 100. Fiber optic cable 12 receives sunlight at a focal point 14 that is approximately one inch below Fresnel lens 100. Fiber optic cable 12 may be of the type manufactured by Edmund Scientific Products as a ⅛-inch diameter bundle of 32 fibers.

Referring now to FIGS. 2 and 2A, there is shown a Fresnel lens 200 that may be of the same type as Fresnel lens 100 of FIG. 1. Fresnel lens 200 is provided with four circular openings 20 proximate the corners thereof, each of which receives a bundle 22 of eight fibers, being ¼ of a conventional 32-fiber bundle 24. Like Fresnel lens 100 of FIG. 1, Fresnel lens 200 of FIG. 2 focuses sunlight at a focal point 14 located at the confluence of the individual fiber bundles 22 that make up fiber bundle 24.

Referring now to FIG. 3, there is shown a tree branch support structure having a tubular central branch 30 and a number of tubular secondary branches 32 connected thereto. Central branch 30 and secondary branches 32 are preferably constructed of a translucent plastic material. Fiber optic bundles 34 are routed through central branch 30 and through respective ones of the secondary branches 32 for connection in the manner illustrated in FIG. 1 to Fresnel lenses 36 that are retained in trays 38 attached at the distal ends of central branch 30 and each of the secondary branches 32. Trays 38 are adapted to be positioned for optimal solar collection by respective ones of the Fresnel lenses 36 retained therein. The solar energy collected by each of the Fresnel lenses 36 is accumulated with that collected by all of the other Fresnel lenses 36 as it is conveyed through fiber optic bundles 34.

Figure 4:
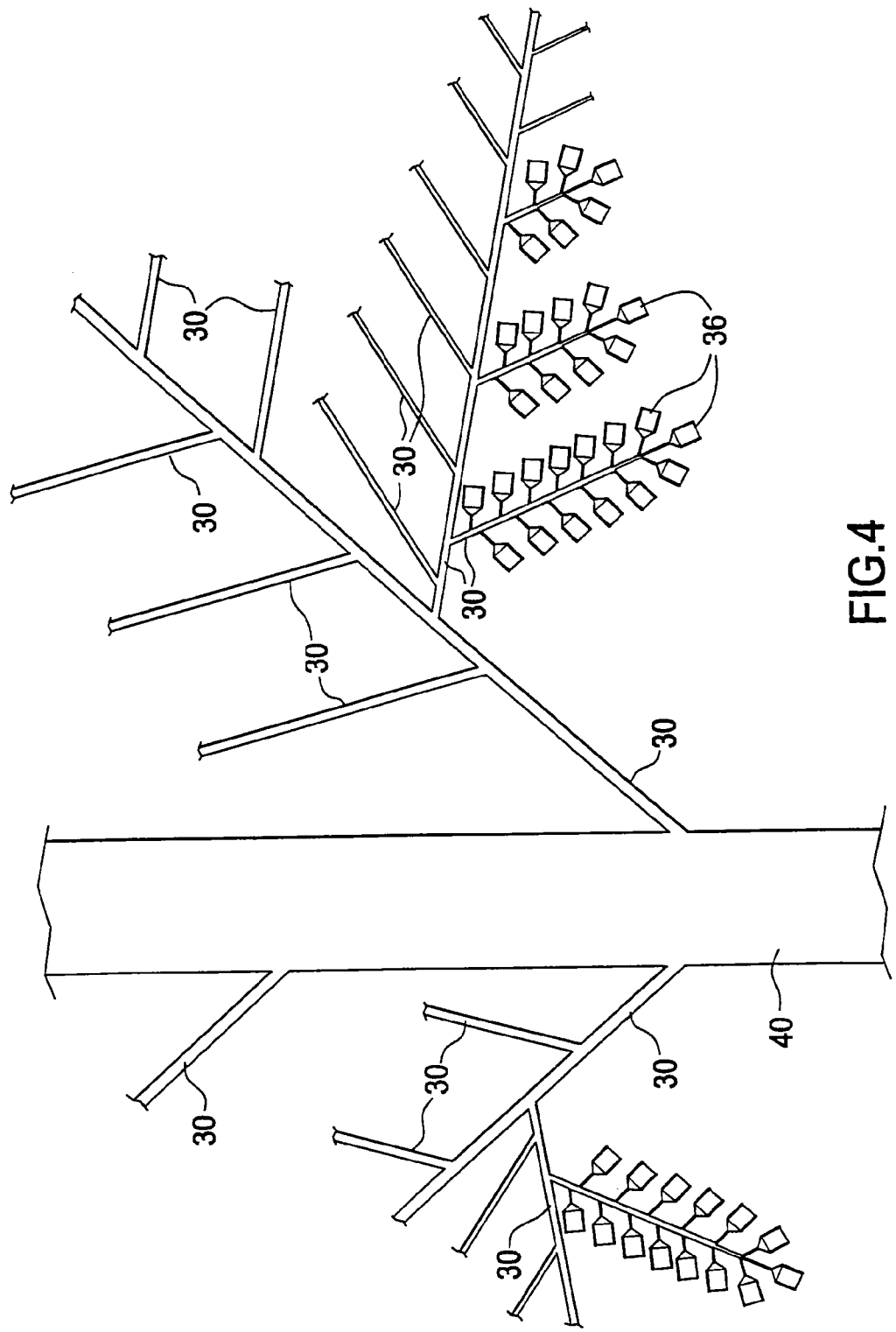
FIG. 4 is a pictorial diagram illustrating an expanded Fresnel lens solar energy collector tree structure formed of a multiplicity of branches like that illustrated in FIG. 3.

Referring now to FIG. 4, there is shown a tree trunk support structure 40 to which multiple ones of the central branches 30 illustrated in FIG. 3 are attached to form an expanded solar collector tree, which again serves to sum the solar energy collected by each of the individual Fresnel lenses 36.

Figure 5:
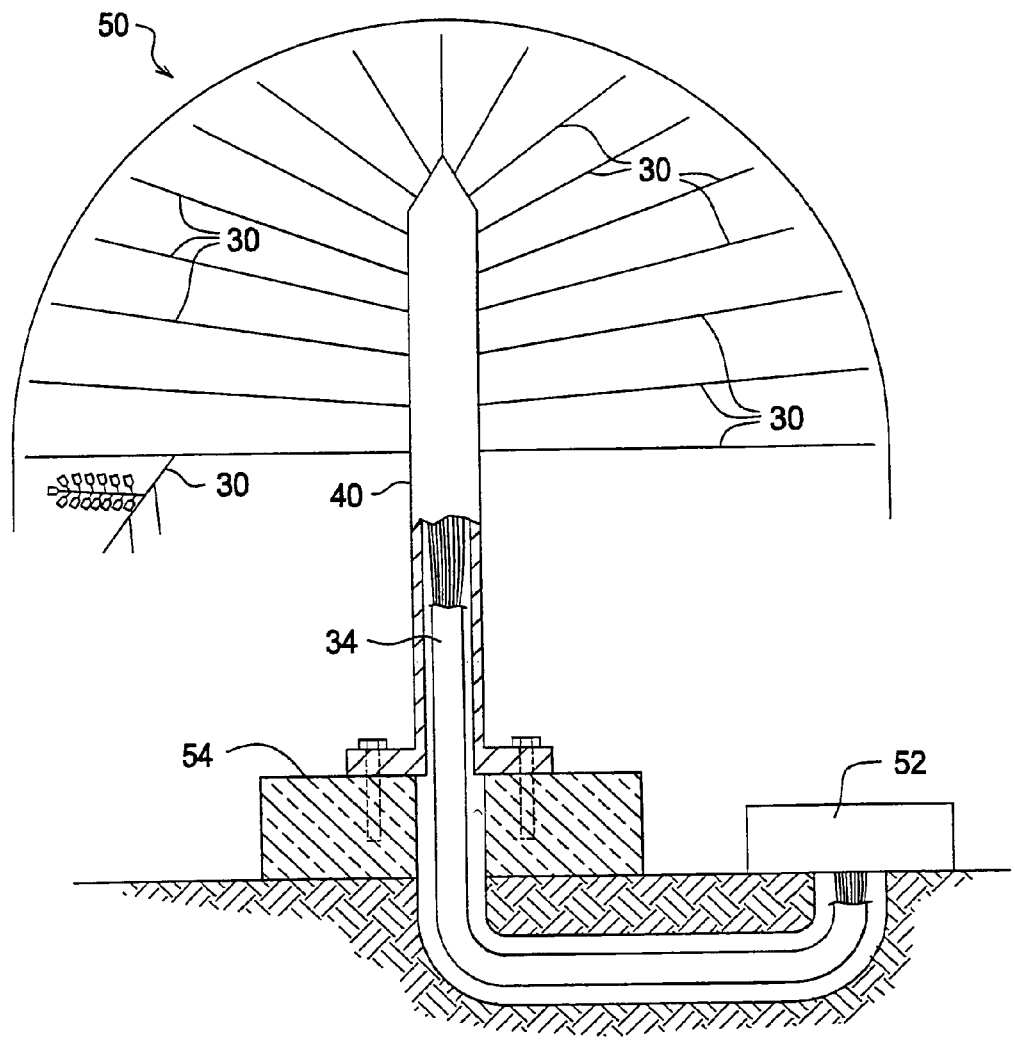
FIG. 5 is a pictorial diagram of a dome-shaped solar energy collector utilizing Fresnel lenses arranged in the form of a tree structure like that illustrated in FIG. 4.

Referring now to FIG. 5, there is shown the tree trunk support structure 40 of FIG. 4 having a plurality of the central branches 30 of FIG. 3 connected thereto to form a generally hemispherical or dome-shaped solar collector structure 50. During daylight hours, each of the individual Fresnel lenses 36 will receive varying amounts of sunlight just as the individual leaves of a natural tree receive varying amounts of sunlight over the course of a day. While not every one of the Fresnel lenses 36 will receive maximum direct sunlight at all times during the day, the cumulative contribution of a large number of such lenses, some of which are receiving maximum sunlight and others of which are receiving partial or no sunlight at any give time, will result in high energy output from the overall dome-shaped solar collector structure 50.

The fiber optic bundles 34 routed within each of the central branches 30 of the dome-shaped solar energy collector structure 50 are in turn routed inside trunk support structure 40 to an external energy receiving device 52 for further processing and utilization of the collected solar energy. Through the use of fiber optic transmission network technology employed by today's telecommunications industry, energy receiving device 52 may represent a power generating plant or other processing facility located miles from the dome-shaped solar energy collector structure 50. Energy receiving device 52 may comprise, for example, a conductive metal having a very high melting point, such as tungsten, to serve as a heat source for utilization of the collected solar energy. The tree trunk support structure 40 of FIG. 5 may be conventionally mounted by means of a ground level concrete base 54, for example.

Figure 6:
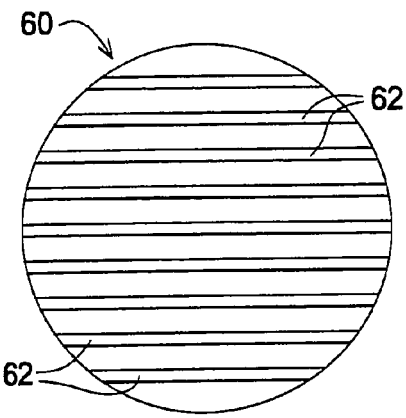
FIG. 6 is a top view of a skeletal hemispherical dome solar energy collector structure illustrating a plurality of semicircular main beams of differing diameter positioned parallel to each other, in accordance with another aspect of the present invention.
Figure 7:
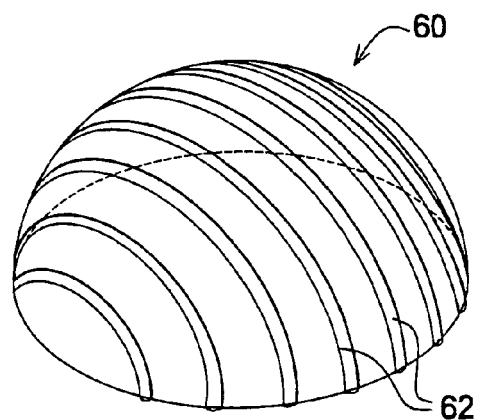
FIG. 7 is a pictorial diagram of the skeletal hemispherical dome solar energy collector structure of FIG. 6.
Figure 8:
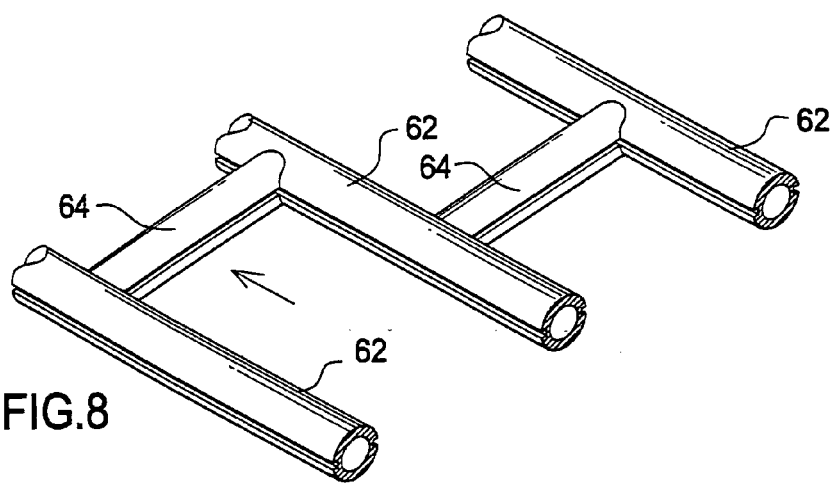
FIG. 8 is a pictorial diagram illustrating portions of three adjacent main beams of the skeletal hemispherical dome solar energy collector structure of FIGS. 6 and 7 together with a typical one of a multiplicity of transverse beams that structurally support the main beams in their parallel relationship.
Figure 9:
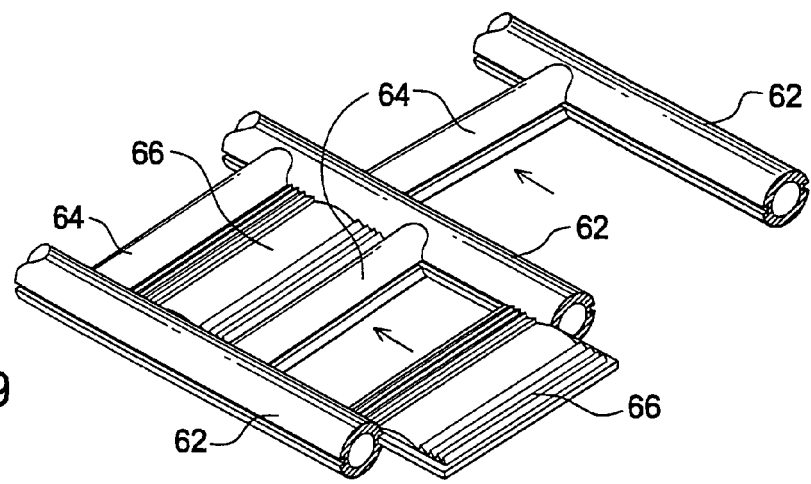
FIG. 9 is a pictorial diagram illustrating how Fresnel lenses are fitted in the openings between adjacent ones of the main beams of the skeletal hemispherical dome solar energy collector structure of FIGS. 6 and 7 and between adjacent ones of the transverse beams that serve to connect the main beams.
Figure 10:
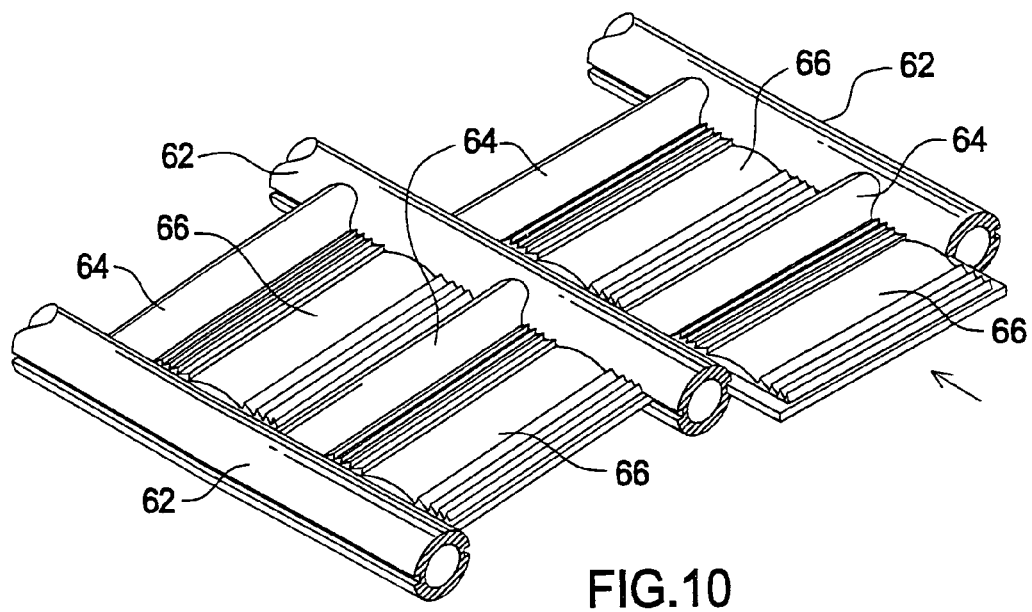
FIG. 10 is a pictorial diagram illustrating four Fresnel lenses positioned in the corresponding openings between adjacent ones of the main and transverse beams of the skeletal hemispherical dome solar energy collector structure of FIGS. 6 and 7.

Referring now to FIGS. 6 and 7, there are shown a top view and a pictorial diagram, respectively, of a skeletal hemispherical dome solar energy collector structure 60 in accordance with another aspect of the present invention. Skeletal dome structure 60 includes a plurality of main beams 62 in the form of semicircular hoops of graduated radius positioned parallel to each other. Main beams 62 are secured at their downwardly-extending ends to a base structure, for example, by any of a number of conventional mounting means. Referring additionally to FIGS. 8-10 and 11, a plurality of transverse beams 64 are connected in spaced apart, staggered positions between adjacent ones of the main beams 62 to provide support for the main beams 62 of FIGS. 6 and 7. In addition, the space between each adjacent pair of the transverse beams 64 and the adjacent pair of the main beams 62 to which they are connected serve to retain a Fresnel lens 66 inserted therein. The spacing between adjacent ones of the main beams 62 and the transverse beams 64 is selected to accommodate Fresnel lenses 66 in the commercially available size of approximately 3.2 meters by 4 meters. Fresnel lenses 66 may be inserted along and be frictionally held in place by longitudinal slots formed in each of the main beams 62 and transverse beams 64. Main beams 62 and 64 may be formed using aluminum tubing or other commercially available material. Alternatively, each of the Fresnel lenses 66 may be of sufficient length so that only one lens is necessary to cover the entire semicircular distance of the space between adjacent ones of the main beams 62. In this arrangement, the number of transverse beams 64 necessary to provide support would be greatly reduced. As a further alternative, the hemispherical surface of the solar energy collector structure 60 may be formed of a single large Fresnel lens.

Figure 11:
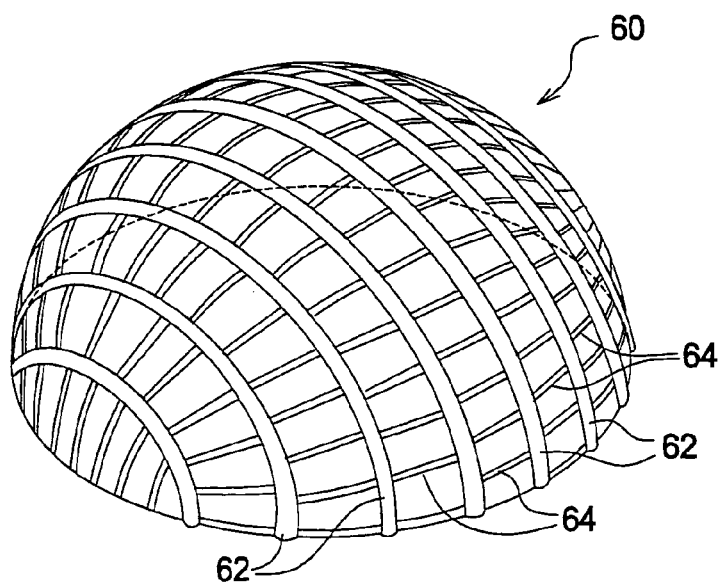
FIG. 11 is a pictorial diagram of the skeletal hemispherical dome solar energy collector structure of FIGS. 6 and 7 illustrating all of the main and transverse beams thereof.
Figure 12:
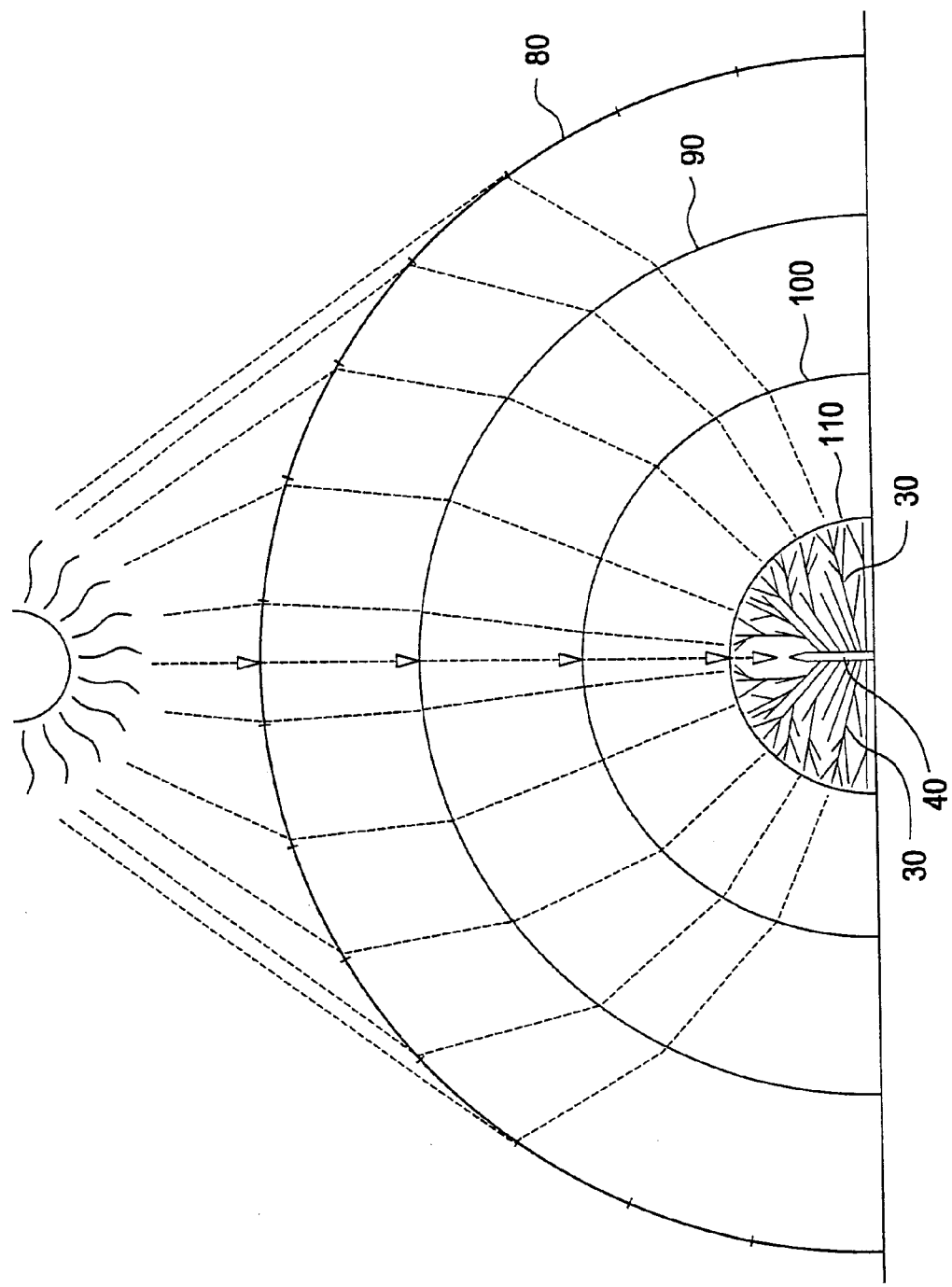
FIG. 12 is a pictorial cross-sectional diagaram of a nested hemispherical dome solar collector structure having an outer dome and three inner domes nested thereunder, the innermost one of the nested domes serving as a collection dome.

Referring now to FIG. 12, there is shown a cross-sectional pictorial diagram of a nested dome hemispherical dome solar energy collector structure having an outer dome 80, and three inner domes 90, 100, 110 nested concentrically thereunder, the innermost dome 110 serving as a collection dome. Each of the domes 80, 90, 100, 110 is skeletally constructed as described above in connection with FIGS. 6-11 with Fresnel lenses 66 positioned in the rectangular spaces between adjacent ones of the main beams 62 and transverse beams 64. Each of the inner domes 90, 100, 110 is sized and positioned such that its surface lies on the focal point of the outer dome 80. The dome structure illustrated in FIG. 12 produces increased solar energy collection, not only due to the increased surface area of the Fresnel lenses that are exposed to the sun, as compared to concave mirror systems of the prior art, but also from the properties of the Fresnel lenses surrounding the lens which is most directly aligned with the sun at the zenith. These surrounding Fresnel lenses serve to realign the light rays which would otherewise be lost back to the central area of each dome surface, as illustrated by the dotted sun ray lines of FIG. 12. This arrangement permits the further multiplication of solar energy focused through each of the domes 80, 90, 100, 110 to a collection area within innermost dome 110 containing a fiber optic solar energy collector network that includes a plurality fiber optic cables connected to each of the Fresnel lenses 66 positioned on the surface of dome 110 and routed through a plurality of fiber optic cable-carrying branches 30, connected as illustrated in FIGS. 3-5, to a fiber optic cable-carrying trunk 40. Alternatively, the fiber optic collector network within dome 110, rather than being connected to each of the Fresnel lenses 66 positioned on the surface of dome 110, may instead be connected as illustrated in FIGS. 1 and 2, to individual Fresnel lenses within the dome 110. In this latter arrangement, dome 110 acts as a focusing dome just as domes 80, 90, 100 do.

Assuming that outer dome 80 is ten meters in radius and that the Fresnel lenses mounted thereon have a focal length of three meters, dome 90 would be constructed to have a radius of 10−3=7 meters. Dome 100 would then be constructed to have a radius of 7−3=4 meters. Assuming that the Fresnel lenses mounted on dome 100 also have focal lengths of three meters, then innermost dome 110 would be constructed to have a radius of 4−3=1 meter. Because of the multiplication factor involved in the focusing of solar energy by the nested dome hemispherical dome solar collector, as illustrated by the sun ray lines shown in FIG. 12, fiber optic collection network within dome 110 must be sized to handle the large amount of solar energy collected. The nested dome hemispherical dome solar energy collector of FIG. 12 is effective in significantly multiplying the solar collection ability of prior art concave mirror solar collectors.

Figure 13:
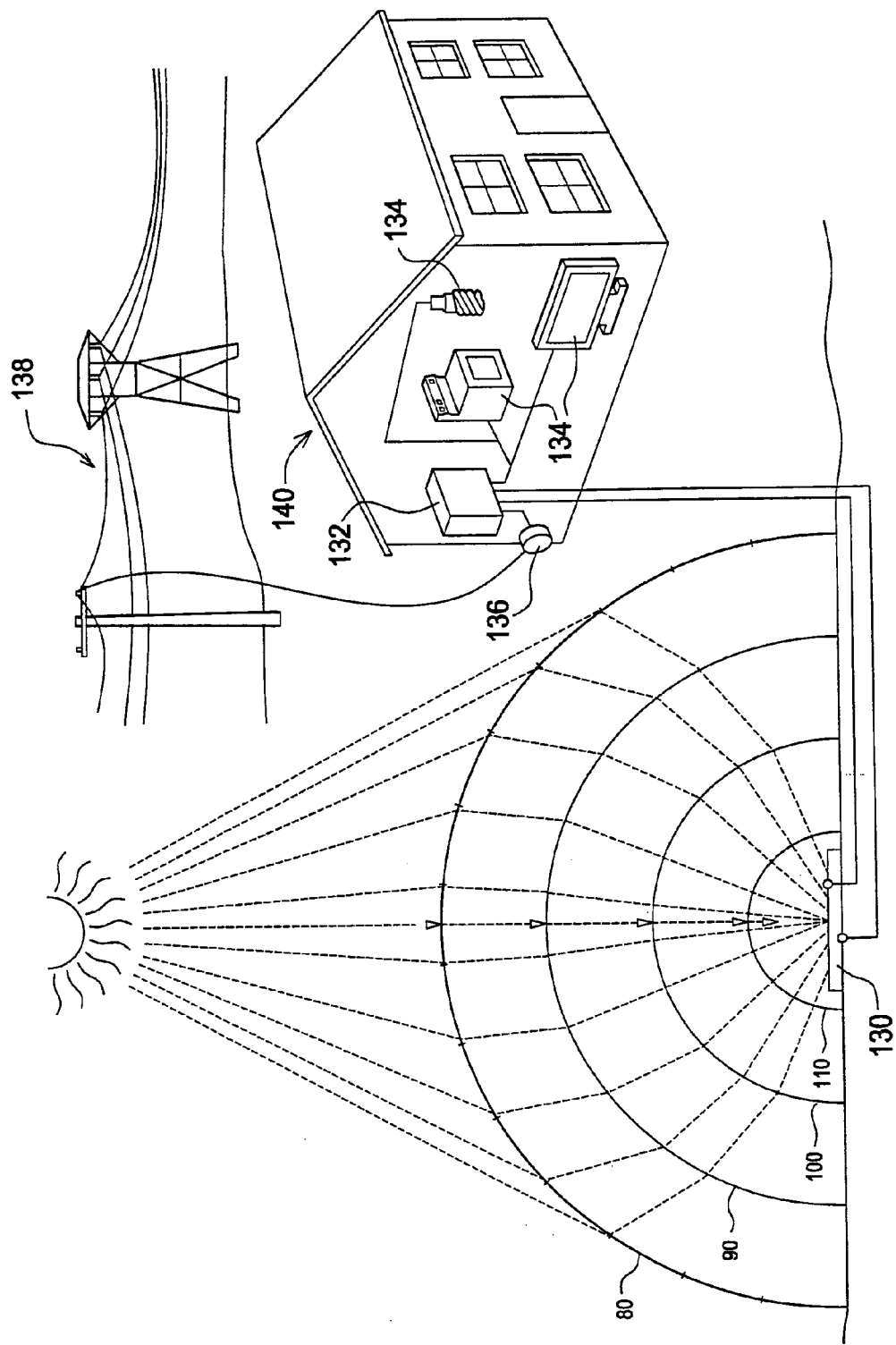
FIG. 13 is a pictorial diagram in accordance with another aspect of the present invention illustrating the placement of a photovoltaic cell on a surface within the innermost one of the nested domes of the hemispherical dome solar energy collector structure of FIG. 12.

Referring now to FIG. 13, there is shown the nested dome hemispherical dome solar energy collector of FIG. 12 in which the fiber optic solar energy collector network within innermost dome 110 has been replaced with a conventional photovoltaic panel 130 positioned on a surface underlying or within dome 110. The photovoltaic panel 130 is positioned such that the focal point of innermost dome 110 lies on the surface of photovoltaic panel 130. As an example of the way in which the structure of FIG. 13 may be employed in a residential application, the DC voltage produced by photovoltaic panel 130 is conveyed to a storage battery and a DC to AC inverter 132 connected to the internal electric wiring of a residence 140. The AC line voltage produced by inverter 132 can be used to directly power various conventional electrical devices 134 within residence 140. Any excess electrical power produced by photovoltaic panel 130 flows backward through a conventional watt hour meter 136 and is conveyed for sale onto the local utility grid 138 that serves residence 140.

Given the dimensional example of the preceding paragraph in which the diameter of the innermost dome 110 is approximately two meters, a rectangular photovoltaic panel 130 approximately 1.5×2 meters in size can be accommodated. Also, given the solar energy multiplication factor achieved by the nested dome hemispherical dome solar energy collector of FIG. 13, this Fresnel lens structure, in combination with the single photovoltaic panel 130, is capable of producing the same amount of electrical power as would be produced by several conventional photovoltaic panels 130 acting alone. Moreover, this greater amount of electrical power can be produced at a significantly reduced cost, given the much lower cost of the domes 80, 90, 100, 110 and the Fresnel lenses 66 positioned thereon, as compared to the cost of the number of conventional photovoltaic panels that would otherwise be required to generate the same amount of electrical power. It should be noted that the solar energy output from the nested dome hemispherical dome solar energy collector structure of the present invention is directly proportional to the size and number of the domes constituting that structure.

It will be appreciated that the nested dome hemispherical dome solar energy collector of FIG. 13, whose output is a DC voltage produced by photovoltaic panel 130, can be mounted on a moving vehicle such that the DC voltage so produced is available for powering the vehicle. Similarly, either the single or multiple Fresnel lens structures of FIGS. 1-5 or the nested dome hemispherical dome solar energy collector of FIG. 12 may be mounted on a moving vehicle, such as a train, that is capable of utilizing the solar heat output to power the train's steam engine or turbine. The production of solar heat or DC voltage in these environments is independent of the speed and orientation of the vehicle and is dependent only upon the presence of incident sunlight.

It will also be appreciated by those skilled in the art that as the sun's position changes with the changing seasons, different areas of the Fresnel lens surface of the single-dome solar energy collector of FIG. 11 or of the multiple surfaces of the nested dome solar energy collector of FIGS. 12 and 13 will serve to collect more solar energy than other areas. As stated above, the domed shape of the solar energy collector of the present invention eliminates the need for sun tracking mechanisms taught in the prior art. In addition, because of the placement of the inner domes of the nested dome hemispherical dome solar energy collector of FIGS. 12 and 13, the sun rays that are not part of the main path collection section of the surface of dome 80 aligned with the sun will assist in forcing the peripheral sun rays to be refocused to the fiber optic network within the innermost dome 110.

I claim:

1. A solar energy collector comprising:
   one or more Fresnel lenses, each having one or more apertures therein;
   a fiber optic bundle positioned in each of said one or more apertures in each of said one or more Fresnel lenses, each fiber optic bundle so positioned depending from an associated one of said one or more Fresnel lenses and being retained in a position such that a focal point of each of said one or more Fresnel lenses lies on said fiber optic bundle, each fiber optic bundle producing heat at an output thereof.

2. A solar energy collector as in claim 1, wherein:
   said one or more Fresnel lenses and said fiber optic bundle are mounted on a moving vehicle having a heat-driven prime mover; and
   said output of said fiber optic bundle is coupled to said heat-driven prime mover.

* * * * *